United States Patent

Shimada et al.

[11] Patent Number: 6,112,321
[45] Date of Patent: Aug. 29, 2000

[54] NONVOLATILE SEMICONDUCTOR STORAGE DEVICE

[75] Inventors: Kazuyuki Shimada; Takashi Murai, both of Fukuyama, Japan

[73] Assignee: Sharp Kabushiki Kaisha, Osaka, Japan

[21] Appl. No.: 09/001,555

[22] Filed: Dec. 31, 1997

[30] Foreign Application Priority Data

Mar. 19, 1997 [JP] Japan ................................ 9-065721

[51] Int. Cl.⁷ .................................................. G11C 29/00
[52] U.S. Cl. ............................................................ 714/718
[58] Field of Search ........................... 714/718; 365/200, 365/201

[56] References Cited

U.S. PATENT DOCUMENTS 5,361,343  11/1994  Kosonocky et al. .................... 395/425
5,563,828  10/1996  Hasbun et al. ....................... 365/185.33

FOREIGN PATENT DOCUMENTS 5-107319  4/1993  Japan .

Primary Examiner—Phung M. Chung

[57] ABSTRACT

A nonvolatile semiconductor storage device includes a repair request global flag for storing information indicating whether any faulty memory cell has been detected in the repair judgment test; and two tag memories, one for storing information indicating the word line associated with a faulty memory cell detected in the repair judgment test, the other tag memory storing bit line information associated with the detected faulty memory cell. A write state machine controls the data written to the repair request global flag and tag memories, and a write state machine algorithm storage section stores algorithms for which the write state machine executes a writing operation to the repair request global flag and tag memories.

14 Claims, 5 Drawing Sheets

NONVOLATILE SEMICONDUCTOR STORAGE DEVICE

BACKGROUND OF THE INVENTION (1) Field of the Invention

The present invention relates to a nonvolatile semiconductor storage device, in particular to a nonvolatile semiconductor storage device which enables a less expensive LSI tester to perform a redundancy repair judgment test thereof.

(2) Description of the Prior Art

The configuration as well as the testing method of a conventional nonvolatile semiconductor storage device will be described referring to FIGS. 1 and 2.

FIG. 1 is a block diagram showing a conventional nonvolatile semiconductor storage device, and FIG. 2 is a flowchart showing a wafer test for the conventional nonvolatile semiconductor storage device.

In FIG. 1, a reference numeral 31 designates an address buffer; 32 a bit-line decoder; 33 a word-line decoder; 34 a memory cell array; 35 an I/O gate; 36 a writing/erasing high-voltage switch; 37 a write-state machine; 38 a status register; 39 an output multiplexer; 40 an input buffer; 41 an output buffer; and 42 a write state machine control algorithm (program) storing section. Writing/erasing high-voltage switch 36 is a voltage switching circuit that selectively outputs high voltages required for writing and erasing. Write state machine 37 is a control circuit that controls writing and erasing operations in accordance with the algorithms stored in control algorithm storing section 42.

As stated above, FIG. 2 is a flowchart showing a wafer test for a conventional nonvolatile semiconductor storage device. The repair judgment test (test 1: writing test, test 2: erasing test, test 3: reading test) is performed for all the memory cells in memory cell array 34, and the result for each is stored into the defect information storing memory in the tester. In the repair routine, the address having a fault stored in the defect information storing memory is analyzed, and if it is repairable, its repair is effected. In the confirmation test, if it is judged as 'good', the next test will be effected.

However, in the above conventional method, the LSI tester needs to have a defect information storing memory for storing address information of faulty memory cells therein. Accordingly, the LSI tester becomes costly, increasing cost for testing.

SUMMARY OF THE INVENTION

It is therefore an object of the present invention to provide a nonvolatile semiconductor storage device which is free from the conventional problems and enables a less expensive LSI tester requiring no defect information storing memory, to perform the redundancy repair judgment test thereof.

To achieve the above object, the present invention is configured as follows:

In accordance with the first aspect of the invention, a nonvolatile semiconductor storage device includes:

a first storage unit for storing the information indicating whether any faulty memory cell has been detected in the repair judgment test; and a second storage unit for storing the information indicating the word line and bit line involving a faulty memory cell detected in the repair judgment test.

In accordance with the second aspect of the invention, a nonvolatile semiconductor storage device includes:

a write state machine which controls data writing and data erasing;

a write-state machine controlling algorithm storing unit for storing algorithms which control the write state machine;

a first storage unit for storing the information indicating whether any faulty memory cell has been detected in the repair judgment test; and a second storage unit for storing the information indicating the word line and bit line involving a faulty memory cell detected in the repair judgment test.

In accordance with the third aspect of the invention, a nonvolatile semiconductor storage device includes:

a write state machine which controls data writing and data erasing;

a write-state machine controlling algorithm storing unit for storing algorithms which control the write state machine;

a first storage means for storing the information indicating whether any faulty memory cell has been detected in the repair judgment test; and a second storage unit for storing the information indicating the word line and bit line involving a faulty memory cell detected in the repair judgment test, wherein the algorithm for the write state machine for executing a writing operation to the storage unit is stored in the write state machine controlling algorithm storing unit.

In accordance with the preferred embodiment of the present invention, when a faulty memory cell is detected in the repair judgment test, the information indicating the fault and the information indicating the word line and bit line involving the faulty memory cell are stored in the respective storage units inside the nonvolatile semiconductor storage device. The control of the writing operation is effected by the write state machine. In the repair routine to be executed after this, the content in the storage units are analyzed and if the fault is repairable, the redundancy replacement will be executed.

Accordingly, in accordance with the nonvolatile semiconductor storage device of the invention, it is no longer necessary for the LSI tester to have a defect information storing memory as needed conventionally, and it becomes possible to use an inexpensive tester. Thus, it is possible to attain reduction of the testing cost.

DESCRIPTION OF THE PREFERRED EMBODIMENTS

An embodiment of the invention will be described hereinbelow with reference to the accompanying drawings.

Figure 1:
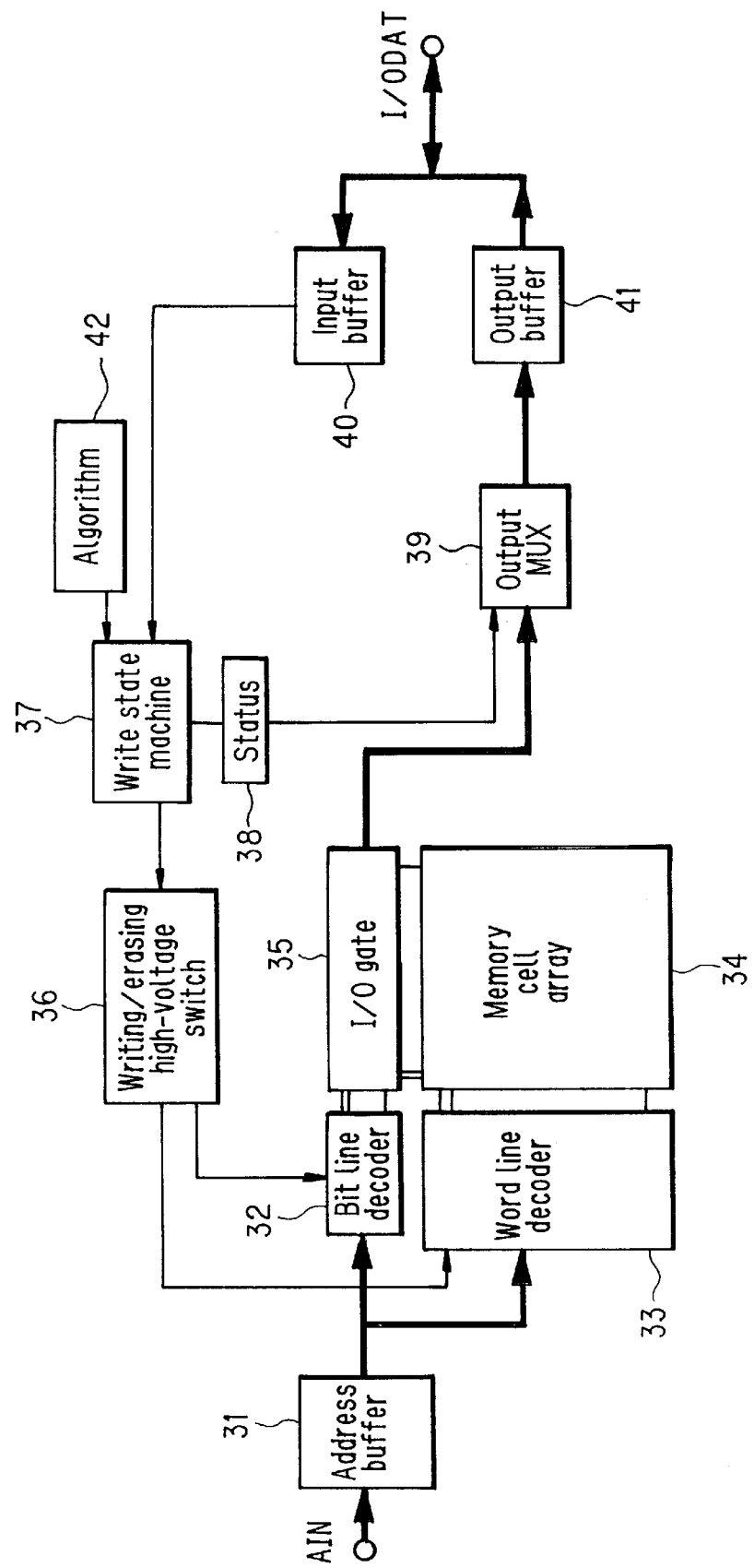
FIG. 1 is a block diagram showing a conventional nonvolatile semiconductor storage device.
Figure 2:
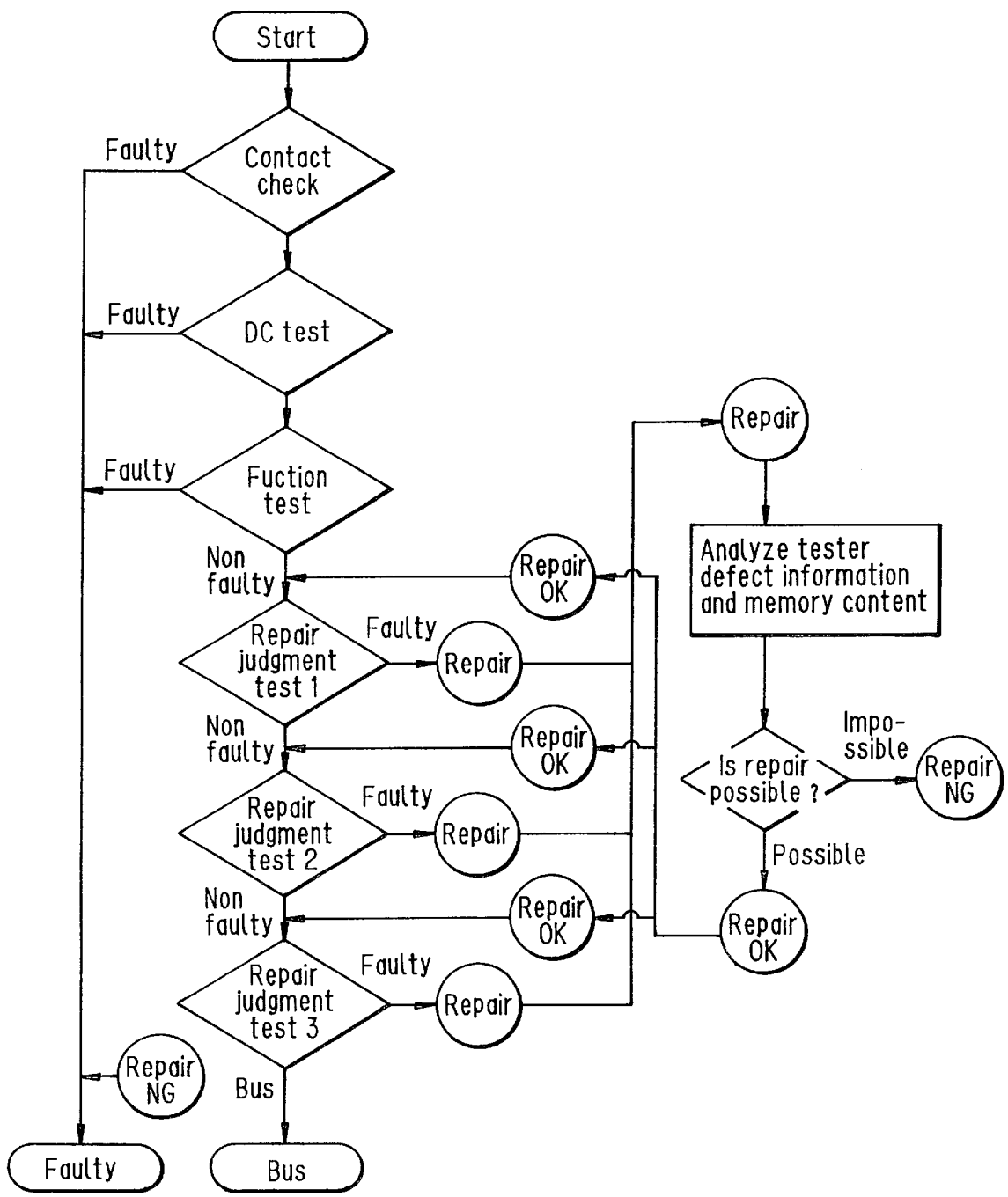
FIG. 2 is a flowchart showing the flow of wafer test in the nonvolatile semiconductor storage device.
Figure 3:
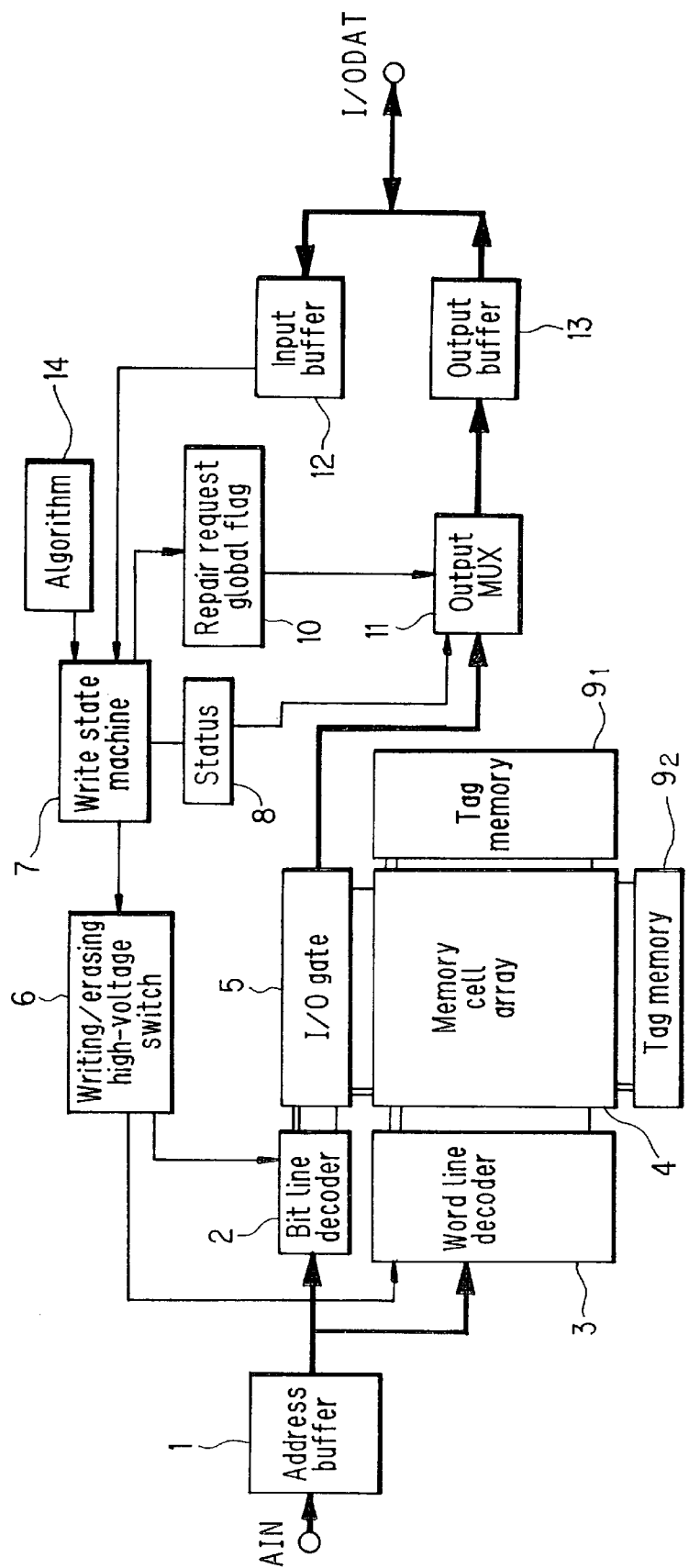
FIG. 3 is a block diagram showing a nonvolatile semiconductor storage device in accordance with an embodiment of the invention.
Figure 4:
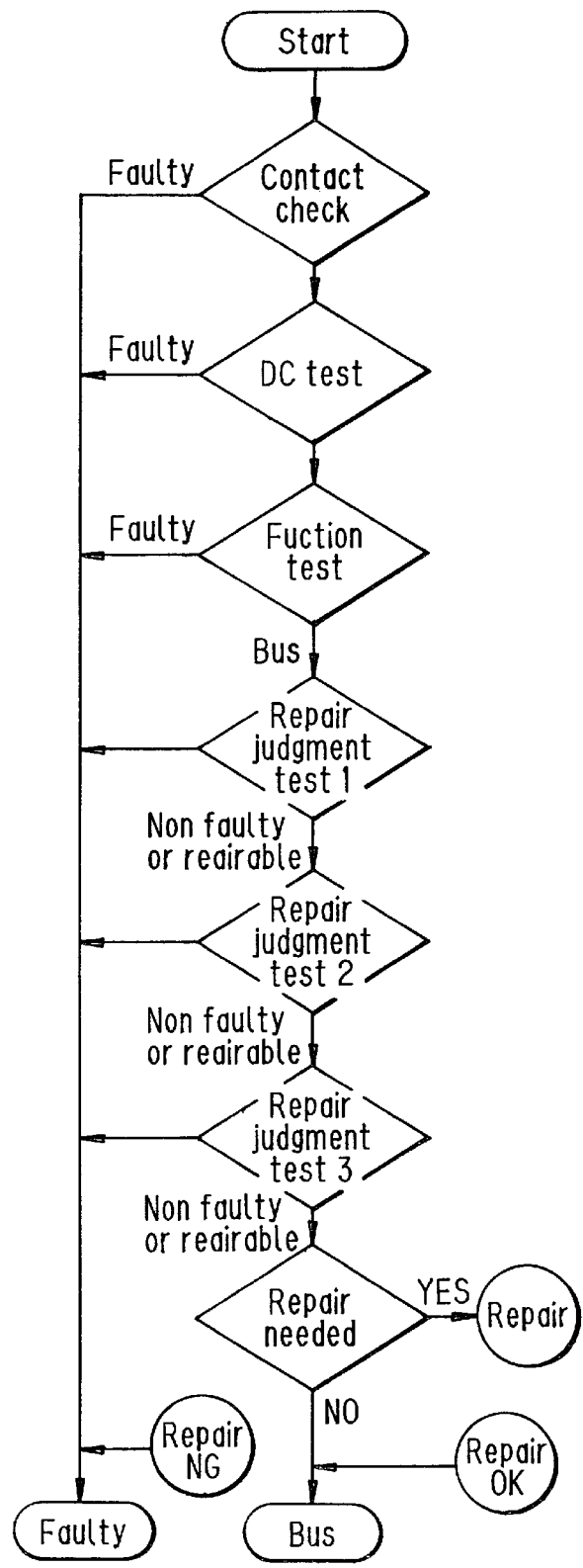
FIG. 4 is a flowchart showing wafer tests in the same embodiment.

FIG. 3 is a block diagram showing a nonvolatile semiconductor storage device of one embodiment of the invention. FIG. 4 is a flowchart showing a wafer test for the nonvolatile semiconductor storage device.

In FIG. 3, a reference numeral 1 designates an address buffer; 2 a bit line decoder; 3 a word line decoder; 4 a memory cell array; 5 an I/O gate; 6 a writing/erasing high-voltage switch; 7 a write state machine; 8 a status register; $9_1$ and $9_2$ tag memories; 10 a repair request global flag; 11 an output multiplexer; 12 an input buffer; 13 an output buffer; and 14 a write state machine control algorithm (program) storing section.

Writing/erasing high-voltage switch 6 is a voltage switching circuit that selectively outputs high voltages required for writing and erasing. Write state machine 7 is a control circuit that controls writing and erasing operations in accordance with the algorithms stored in control algorithm storing section 14.

Tag memory $9_1$ consists of as many flags as the number of word lines, each flag being provided for one word line of memory cell array 4. Tag memory $9_2$ consists of as many flags as the number of bit lines, each flag being provided for one bit line of memory cell array 4. Each flag constituting the tag memory is composed of a nonvolatile memory cell having the same configuration of the nonvolatile memory cell constituting memory cell array 4, except in that the circuit will not allow erasure. This configuration is to prevent the once written information being erroneously erased. In the repair judgment test, if a faulty memory cell is detected, the corresponding flags in tag memories $9_1$ and $9_2$ (flags corresponding to the word line and bit line on which the faulty memory cell resides) will be set. If the flag has been already set, setting will not be repeated.

Repair request global flag 10 is a flag that will be set when a faulty memory cell has been detected. This repair request global flag is also composed of a nonvolatile memory cell having the same configuration of the nonvolatile memory cell constituting memory cell array 4. In this case, the erasure in the circuit is prohibited. Also in the repair request global flag, if the flag has been already set, setting will not be repeated.

As stated above, FIG. 4 is a flowchart showing a wafer test in accordance with the invention. After the execution of different tests, i.e., contact check, d.c. test and function test, repair judgment test 1 is effected. This repair judgment test 1 is a writing test. This writing test (writing, reading and verification) is sequentially performed for each memory cell from the topmost address. If any faulty cell is detected, the flag from repair request global flag 10 and corresponding flags in tag memories $9_1$ and $9_2$ are set. This operation is executed in accordance with the writing control algorithm stored in a write-state machine control algorithm storing section 14. As stated above, if repair request global flag 10 or a flag in the tag memories has been set, no repeated setting operation will be performed. When the test for the memory cell at the bottom-most address is finished, the operation goes to the next step, a repair judgment test 2. A chip which has been judged as unrepairable in repair judgment test 1, is discarded as a defective.

Repair judgment test 2, is an erasing test. Similar to the above writing test, the erasing test (erasing, reading and verification) is sequentially performed for each memory cell from the topmost address. If any faulty cell is detected, the flag from repair request global flag 10 and corresponding flags in tag memories $9_1$ and $9_2$ are set. This operation is executed in accordance with the writing control algorithm stored in write-state machine control algorithm storing section 14. As stated above, if repair request global flag 10 or a flag of the tag memories has been set, no repeated setting operation will be performed. When the test for the memory cell at the bottom-most address is finished, the operation goes to the next step, a repair judgment test 3. A chip which has been judged as unrepairable in repair judgment test 2, is discarded as a defective.

Repair judgment test 3 is a reading test. Similar to the above two tests, the reading test is sequentially performed for each memory cell from the topmost address. If any faulty cell is detected, the flag from repair request global flag 10 and corresponding flag in tag memories $9_1$ and $9_2$ are set. This operation is executed in accordance with the writing control algorithm stored in write-state machine control algorithm storing section 14. As stated above, if repair request global flag 10 or a flag of the tag memories has been set, no repeated setting operation will be performed. When the test for the memory cell at the bottom-most address is finished, the operation goes to the next step, a repair needed or unneeded judgment step. A chip which has been judged as unrepairable in repair judgment test 3, is discarded as a defective.

Concerning the setting of repair request global flag 10, this flag may be adapted to be set if one flag in either tag memory $9_1$ or $9_2$ has been set at each end of repair judgment tests 1, 2 and 3.

In the repair needed/unneeded judgment step, the state of repair request global flag 10 is checked. If the flag stays in the reset state, the chip is processed as a proper product containing no faulty memory cells.

Figure 5:
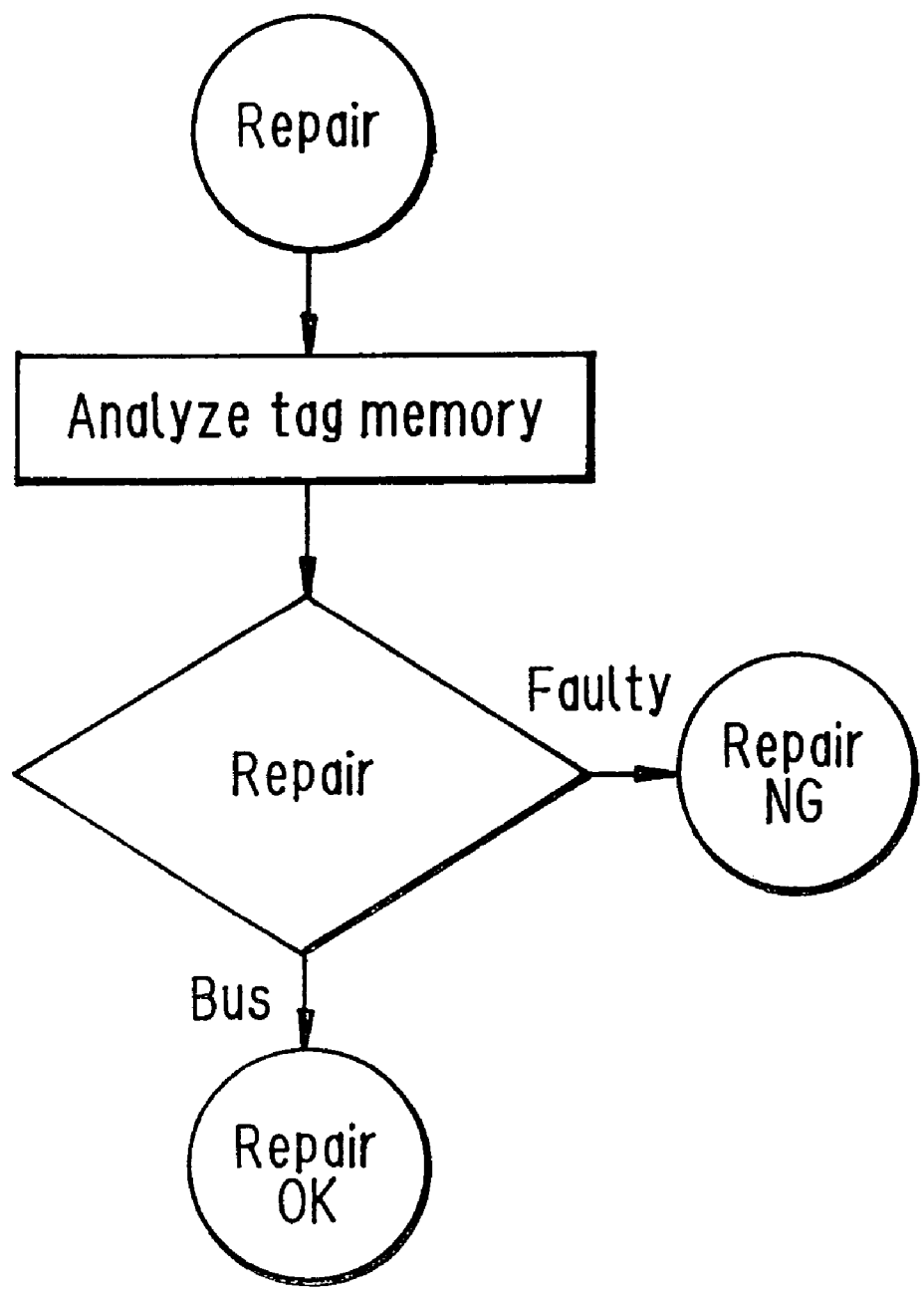
FIG. 5 is a flowchart showing in detail the repair routine of FIG. 4.

On the other hand, if repair request global flag 10 has been set, the operation goes to a repair routine shown in FIG. 5. In this repair routine, the contents of tag memories $9_1$ and $9_2$ are analyzed, and if it is judged that the fault is repairable, a predetermined redundancy replacement process is performed. Illustratively, the word line and/or bit line involving the faulty memory cell is cut away from the decoder circuit by cutting fuses etc., and a replacement address programming procedure in the redundancy decoder is performed by selective fuse cutting, etc. From the result of the content analysis of tag memories $9_1$ and $9_2$, when a fault is determined as unrepairable, the product is discarded as a defective.

In the above embodiment, the repair judgment test is performed as a wafer test, but the repair judgment test and repair routine may be performed in the package test after assembly.

As has been described in detailed, the nonvolatile semiconductor storage device is characterized by having: a first storage unit for storing the information indicating whether any faulty memory cell has been detected in the repair judgment test; and a second storage unit for storing the information indicating the word line and bit line involving a faulty memory cell detected in the repair judgment test. Further, the nonvolatile semiconductor storage device of the invention is characterized by having: a write state machine which controls data writing and data erasing; a write-state machine controlling algorithm storing unit for storing algorithms which control the write state machine; a first storage unit for storing the information indicating whether any faulty memory cell has been detected in the repair judgment test; and a second storage unit for storing the information indicating the word line and bit line involving a faulty memory cell detected in the repair judgment test, wherein the algorithm for the write state machine for executing a writing operation to the storage unit is stored in the write state machine controlling algorithm storing means.

Thus, in accordance with the nonvolatile semiconductor storage device of the invention, in the repair judgment test, it becomes possible to judge whether or not there is a fault in the storage device using an inexpensive tester which needs no defect information storing memory as needed conventionally, thus making it possible to attain reduction of the testing cost.

What is claimed is:

1. A nonvolatile semiconductor storage device for use in a repair judgment test for a semiconductor chip, comprising:
    a first storage unit for storing information indicating whether any faulty memory cell has been detected in said repair judgment test; and
    a second storage unit for storing word line information associated with said detected memory cell; and
    a third storage unit for storing bit line information associated with said detected faulty memory cell, said storage units obviating a need to employ an independent defect information storing memory for storing address information of faulty memory cells in the nonvolatile semiconductor storage device.

2. The nonvolatile semiconductor storage device of claim 1, said first storage unit including a repair request global flag memory which activates based on an algorithm to store data indicative of a detected faulty memory cell, said global flag memory remaining set upon indications of further faulty memory cells to prevent inadvertent erasure of once-written information.

3. The nonvolatile semiconductor storage device of claim 1, said second storage unit including a word line flag memory which activates based on an algorithm to store word line data associated with detected faulty memory cell, and said third storage unit including a bit line flag memory which activates based on an algorithm to store bit line data associated with said detected faulty memory cell, said word line and bit line flag memories remaining set upon indications of further faulty memory cells to prevent inadvertent erasure of once-written information.

4. The nonvolatile semiconductor storage device of claim 3, wherein when said repair request global flag has been set; said word line and bit line flag memories are analyzed to determine whether said faulty memory cell is repairable.

5. The nonvolatile semiconductor storage device of claim 1, wherein said repair judgment test is a wafer test performed prior to assembling the semiconductor chip in a circuit.

6. The nonvolatile semiconductor storage device of claim 1, wherein said repair judgment test is a package test performed after assembling the semiconductor chip in a circuit.

7. A nonvolatile semiconductor storage device used in a repair judgment test for a semiconductor chip comprising:
    a write state machine which controls data writing and data erasing;
    a write state machine controlling algorithm storing unit for storing algorithms which control said write state machine;
    a first storage unit for storing information indicating whether any faulty memory cell has been detected in said repair judgment test;
    a second storage unit for storing word line information associated with said detected faulty memory cell; and
    a third storage unit for storing bit line information associated with said detected faulty memory cell, said storage units obviating a need to employ an independent detect information storing memory for storing address information of faulty memory cells in the nonvolatile semiconductor storage device.

8. A nonvolatile semiconductor storage device used in a repair judgment test for a semiconductor chip, comprising:
    a write state machine which controls data writing and data erasing;
    a write state machine controlling algorithm storing unit for storing a plurality of algorithms which control the write state machine;
    a first storage unit for storing information indicating whether any faulty memory cell has been detected in a repair judgment test; and
    a second storage unit for storing word line information associated with said detected faulty memory cell; and
    a third storage unit for storing bit line information associated with said detected faulty memory cell,
        wherein said plurality of algorithms are for executing a writing operation to said first through third storage units.

9. A storage device for testing repairability of a semiconductor chip, comprising:
    a repair request global flag memory which activates based on an algorithm to store data indicative of a detected faulty memory cell, said detection performed as part of a repair judgment test;
    a word line flag memory which activates based on an algorithm to store word line data associated with said detected faulty memory cell; and
    a bit line flag memory which activates based on an algorithm to store bit line data associated with said detected faulty memory cell, said memories obviating a need to employ an independent defect information memory for storing address information of faulty memory cells indicating a defective chip.

10. The storage device of claim 9, each of said memories remaining set upon indications of further faulty memory cells to prevent inadvertent erasure of once-written information.

11. The storage device of claim 9, wherein when said repair request global flag has been set; said word line and bit line flag memories are analyzed to determine whether said faulty memory cell is repairable.

12. The storage device of claim 9, wherein said repair judgment test is a wafer test performed prior to assembling the semiconductor chip in a circuit.

13. The storage device of claim 9, wherein said repair judgment test is a package test performed after assembling the semiconductor chip in a circuit.

14. A method for repair testing a semiconductor chip, comprising:
    performing a series of repair judgment tests to detect a faulty memory cell indicating a defective chip;
    activating a first memory to store data indicative of the detected faulty memory cell, said detection performed as part of a repair judgment test;
    activating a second memory to store word line data associated with said detected faulty memory cell; and
    activating a third memory to store bit line data associated with said detected faulty memory cell; and
    analyzing said second and third memories to determine whether said faulty memory cell is repairable, said memories thereby obviating a need to employ an independent defect information memory for storing address information of faulty memory cells indicating a defective chip.

* * * * *